United States Patent
Wytman

[11] Patent Number: 5,993,141
[45] Date of Patent: *Nov. 30, 1999

[54] INDEPENDENT LINEAR DUAL-BLADE ROBOT AND METHOD FOR TRANSFERRING WAFERS

[75] Inventor: Joe Wytman, Los Gatos, Calif.

[73] Assignee: Applied Materials, Inc., Santa Clara, Calif.

[*] Notice: This patent is subject to a terminal disclaimer.

[21] Appl. No.: 09/062,487

[22] Filed: Apr. 17, 1998

Related U.S. Application Data

[63] Continuation of application No. 08/634,101, Apr. 17, 1996, Pat. No. 5,810,549.

[51] Int. Cl.⁶ .................................................. B66C 23/00
[52] U.S. Cl. ....................................... 414/744.2; 414/935
[58] Field of Search ........................... 414/217, 744.2, 414/744.4, 744.5, 744.6, 935, 936, 805, 806; 901/8

[56] References Cited

U.S. PATENT DOCUMENTS

| | | | |
|---|---|---|---|
| 4,770,590 | 9/1988 | Hugues | 414/172 |
| 4,871,290 | 10/1989 | Kaczynski | 414/331 |
| 5,011,366 | 4/1991 | Miller | 414/786 |
| 5,135,349 | 8/1992 | Lorenz et al. | 414/744.6 |
| 5,288,199 | 2/1994 | Enomoto | 414/749 |
| 5,372,471 | 12/1994 | Wu | 414/786 |
| 5,447,409 | 9/1995 | Grunes et al. | 414/744.6 |
| 5,584,647 | 12/1996 | Uehara et al. | 414/744.5 |
| 5,810,549 | 9/1998 | Wytman | 414/786 |

*Primary Examiner*—Donald W. Underwood
*Attorney, Agent, or Firm*—Fulbright & Jaworsky LLP

[57] ABSTRACT

An independent dual-blade robot assembly is provided for use in semiconductor wafer processing. The robot assembly includes a rotatable stage located within a chamber, a linear track mounted on an upper surface of the rotatable stage, and article first and second motorized platens slidably mounted on the linear track and configured for movement along a longitudinal axis of the linear track. Each motorized platen is magnetically driven and carries an end effector which extends from a leading edge. The end effectors of the first and second motorized platens are preferably horizontally coplanar. The linear track may be a single track carrying both motorized platens, or two linear track sections may be provided where each carries a single motorized platen. The two track sections may be pivotally or rotatably connected to the rotatable stage.

8 Claims, 8 Drawing Sheets

INDEPENDENT LINEAR DUAL-BLADE ROBOT AND METHOD FOR TRANSFERRING WAFERS

SPECIFICATION

This application is a continuation of U.S. patent application Ser. No. 08/634,101, filed Apr. 17, 1996, now U.S. Pat. No. 5,810,549.

BACKGROUND OF THE INVENTION

The present invention relates to the transfer of articles, such as semiconductor wafers, and more particularly to a dual-blade robot for effecting independent linear transfer of two or more semiconductor wafers.

The use of robot arms is a well established manufacturing expedient in applications where human handling of the wafers is inefficient and/or undesired. For example, in the semiconductor arts robot arms are used to handle wafers during various process steps. Such process steps include those which occur in a process chamber, e.g. etching, deposition, passivation, etc., where a sealed environment must be maintained to limit the likelihood of contamination and to ensure that various specific processing conditions are provided.

Current practice includes the use of one or more robot arms to load semiconductor wafers from a wafer cassette into various processing ports within a multiple process chamber system. Such systems typically include a central chamber, to which the wafer cassette and process chambers are linked. The robot arm is then employed to retrieve the wafer from a particular port after processing within an associated process chamber. The wafer is then shuttled by the robot arm to a next port for additional processing. When all processing within the reaction system is complete, the robot arm returns the semiconductor wafer to the loading port. Typically, a stack of several semiconductor wafers is handled in this manner during each process run, and several wafers may be in process at any point in time.

In multiple process chamber systems, it is desirable to have more than one semiconductor wafer in process at a time. In this way, the process system is used to obtain maximum throughput. In the art, where a single robot arm is used in a process system to shuttle wafers between wafer cassettes and process chambers, the robot may require complex movement to simply switch two wafers in two single wafer process chambers.

One way to increase the efficiency of the robot is to provide a robot arm having the ability to handle two wafers at the same time. Thus, some equipment manufacturers have provided a robot arm in which the two robot blades are rotated about a pivot by a motor with a belt drive at the end of the arm. In this way, one wafer may be stored on one carrier while the other carrier is used to retrieve and place a second wafer. The carriers are then rotated and the stored wafer may be placed as desired. Such mechanism is rather complex and requires a massive arm assembly to support the weight of a carrier drive located at the end of an extendible robot arm. Furthermore, such a mechanism does not allow independent operation of the two carriers.

SUMMARY OF INVENTION

The present invention is an apparatus for transferring an article which allows independent operation of two or more article carriers. The apparatus according to a primary aspect of the invention comprises a rotatable stage located within a chamber, a linear track mounted on an upper surface of said rotatable stage, and article handling means slidably mounted on said linear track and configured for movement along a longitudinal axis of said linear track. The chamber may be a vacuum chamber, such as is used in the transfer of semiconductor wafers during processing. The article handling means preferably includes a first slider block slidably mounted on said linear track with a first end effector (wafer holding blade) extending from a leading edge thereof, and a second slider block slidably mounted on said linear track with a second end effector extending from a leading edge thereof. Each of the first and second slider blocks may be a motorized platen including a plurality of coils electrically connected to a power supply. The track may include a plurality of spaced raised metallic edges extending laterally across the track from an upper surface thereof, and linear bearing surfaces extending longitudinally along the edges thereof. The end effectors are preferably horizontally co-planar.

According to a further aspect of the invention, the linear track may comprise a plurality of linear track sections, and preferably two linear track sections. Each one of the linear track sections may be pivotally connected at one end thereof to the rotatable stage. A first linear track section may be pivotally mounted on the rotatable stage at a position 180° from the pivotal mounting position of the second linear track section, and each of linear track section may be rotated at least 180° about the pivotal connection. Drive means may be provided for imparting rotatory motion to said rotatable stage and for imparting pivotal motion to each of said linear track sections.

A still further aspect of the invention provides that a circular race may be formed in the upper surface of the rotatable stage, with which the plurality of linear track sections are movably engaged. Preferably two linear track sections are engaged with the race, and each may be slidably mounted in the circular race to permit 360° rotation of the track sections about a central axis of the rotatable stage. Drive means may be provided for imparting rotary motion to said rotatable stage and for imparting rotary motion to each of said linear track sections within said circular race.

A further aspect of the present invention is a method for transferring articles using an article transfer apparatus located in a central transfer chamber. The method, according to this aspect of the invention, comprises the steps of transferring a first article between the transfer chamber and one of a plurality of adjacent chambers by moving a first article handling means of said article transfer apparatus along a longitudinal axis of a linear track upon which the article handling means is mounted; and transferring a second article, independent of the transfer of the first article, between the transfer chamber and one of said plurality of adjacent chambers by moving a second article handling means of the article transfer apparatus along the longitudinal axis of said linear track. The step of transferring a first article preferably comprises the steps of aligning a first end effector extending from a leading edge of said article first handling means with an opening between said transfer chamber and one of said plurality of adjacent chambers; extending said first end effector through said opening into said one of said plurality of adjacent chambers by moving the first article handling means along the longitudinal axis of the linear track; effecting a wafer transfer between said first end effector and said one of said plurality of adjacent chambers; and retracting said first end effector from said one of said plurality of adjacent chambers through said opening into said transfer chamber by moving the first article handling means along the longitudinal axis of the linear track. Similarly, the step of transferring a second article preferably comprises the steps of aligning a second end effector extending from a leading edge of said second article handling means with an opening between said transfer chamber and one of said plurality of adjacent chambers; extending said second end effector through said opening into said one of said plurality of adjacent chambers by moving the second article handling means along the longitudinal axis of the linear track; effecting a wafer transfer between said second end effector and said one of said plurality of adjacent chambers; and retracting said second end effector from said one of said plurality of adjacent chambers through said opening into said transfer chamber by moving the second article handling means along the longitudinal axis of the linear track. The steps of aligning the first end effector and aligning the second end effector may be accomplished by rotating a rotatable stage upon which said linear track is mounted. The steps of moving the first and second article handling means each may include the step of sequentially connecting a power source to each one of a plurality of coils located in each of the first and second article handling means to create a magnetic effect between the first or second article handling means and the linear track.

According to a further aspect of the method for transferring articles, the linear track may include a first linear track section and a second linear track section. According to this aspect, the steps of moving the first and second article handling means along the longitudinal axis of the linear track may comprise moving the first article handling means along the first track section and moving the second article handling means along the second track section. One end of each of the first and second linear track sections may be pivotally mounted to a central rotatable stage, and the step of transferring the first and second articles preferably includes the step of pivoting at least one of the first and second linear track sections to align the first or second article handling means with an opening between the transfer chamber and one of the plurality of adjacent chambers. Alternatively, one end of each of the first and second linear track sections may be rotatably mounted in a race of a central rotatable stage, and the step of transferring the first and second articles preferably includes the step of rotating at least one of said first and second linear track sections to align said first or second article handling means with an opening between said transfer chamber and one of said plurality of adjacent chambers. According to these aspects of the invention, the steps of transferring the first article and transferring the second article may be performed either sequentially or simultaneously.

These and other features, aspects and advantages of the present invention will become better understood by referring to the following detailed description, drawings and claims, wherein examples of the presently preferred embodiments are given for purposes of illustration and disclosure.

DETAILED DESCRIPTION

Figure 1:
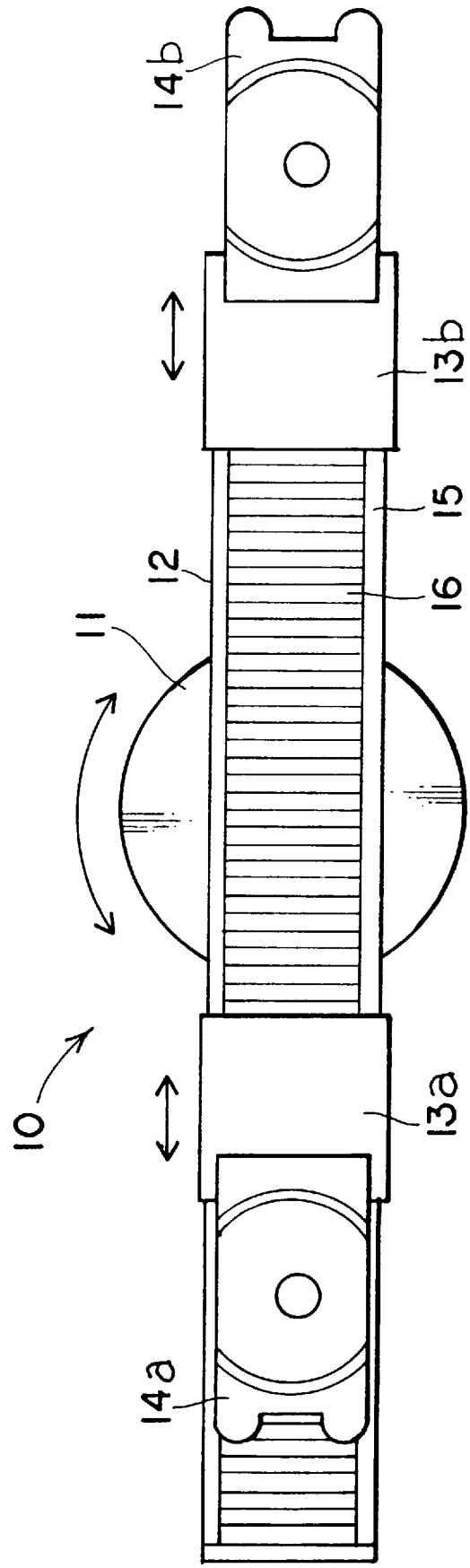
FIG. 1 is a top plan view of an independent dual-blade robot according to a first aspect of the present invention.

The present invention is best understood by referring to the Drawings in connection with review of this Description. The present invention is a robot for independently effecting transfer of two or more articles, such as semiconductor wafers, within a system such as a semiconductor wafer processing system. The robot may be positioned within a central transfer chamber of the wafer processing system and includes means for independently transferring two or more articles between the transfer chamber and adjacent chambers through linear movement of the robot end effectors.

Figure 2:
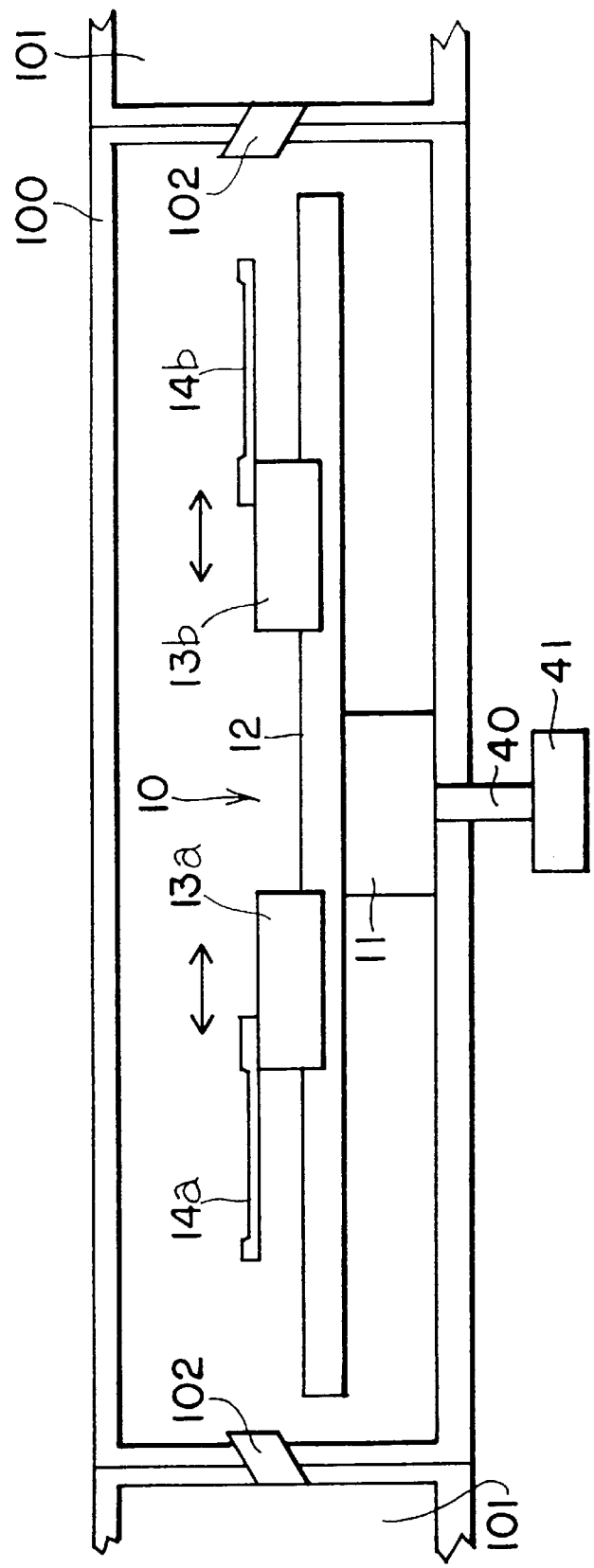
FIG. 2 is a side elevational view of the independent dual-blade robot of FIG. 1.

In FIGS. 1 and 2, an independent dual-blade robot assembly 10 is shown in the context of a semiconductor wafer processing system. The independent dual-blade robot assembly 10 is centrally arranged within a transfer chamber 100 of the wafer processing system. The transfer chamber 100 is connected to a plurality of adjacent chambers 101, such as process chambers for deposition, etching or the like, by a corresponding plurality of slit valves 102. The robot assembly 10 includes a rotatable stage 11 connected to a drive shaft 40 which extends through a sealed aperture in the lower wall of the chamber. A drive motor 41 is connected to a lower end of the drive shaft 40 below the transfer chamber 100 and rotates the stage 11, as needed, through a full 360° range of motion. A linear track 12 is mounted on an upper end of the stage 11 within the transfer chamber 100, and a pair of motorized platens 13a, 13b are slidably mounted thereon. Each motorized platen 13a, 13b carries an end effector 14a, 14b, respectively, on a leading edge thereof.

Figure 3:
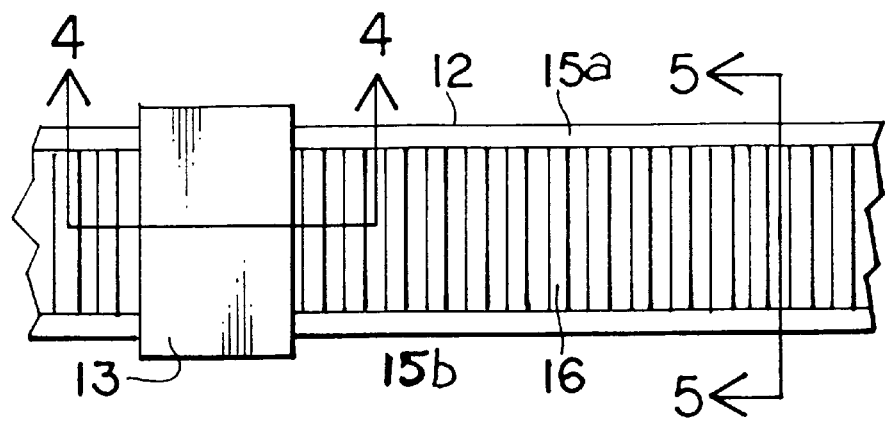
FIG. 3 is a sectional view of a portion of the independent dual-blade robot of FIG. 1.
Figure 4:
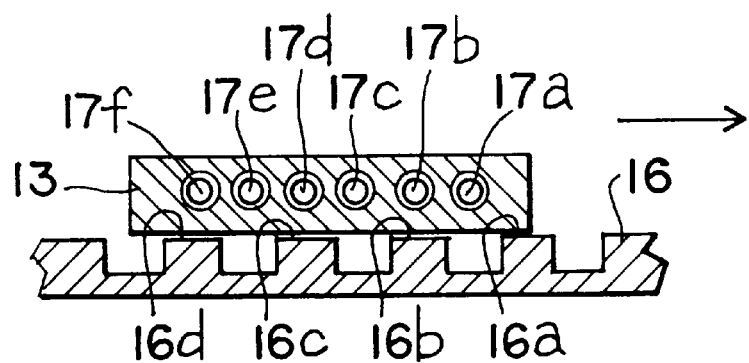
FIG. 4 is a side sectional view of the portion of the robot of FIG. 3, taken along the line 4—4.
Figure 5:
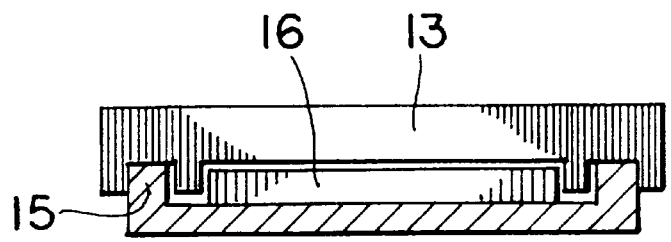
FIG. 5 is an end sectional view of the portion of the robot of FIG. 3, taken along the line 5—5.

As best shown in FIGS. 3–5, an upper surface of the linear track 12 has a linear bearing 15 extending along each of the longitudinal edges thereof to guide the motorized platens 13a, 13b along the track 12. The linear bearings 15 are preferably formed of stainless steel. The central portion of the track upper surface includes a plurality of raised metal edges 16, disposed in a spaced, parallel relation to one another and substantially perpendicular to the linear bearings 15a, 15b. The raised metal edges 16 are preferably formed of a ferromagnetic material, such as iron, which is preferably coated with a thin protective layer of corrosion resistant material such as zinc. A plurality of coils 17 are carried within each of the motorized platens 13a, 13b, for electromagnetically interacting with the raised metal edges 16 of the linear track 12. The motorized platens 13a, 13b are driven along the length of the linear track 12 by sequentially applying current to the coils 17, which causes a particular coil to be attracted to a nearby metal edge 16. The current is supplied by a power source such as a servo amplifier 18 which supplies pulsed current to the coils in a controlled sequence to effect movement of the platens 13a, 13b. Any manner of sequential application of the current to the coils may be employed. According to one aspect, the servo amplifier 18 may be connected to a switch 19 which can selectively apply the current to one or more of the plurality of coils 17.

Figure 6A:
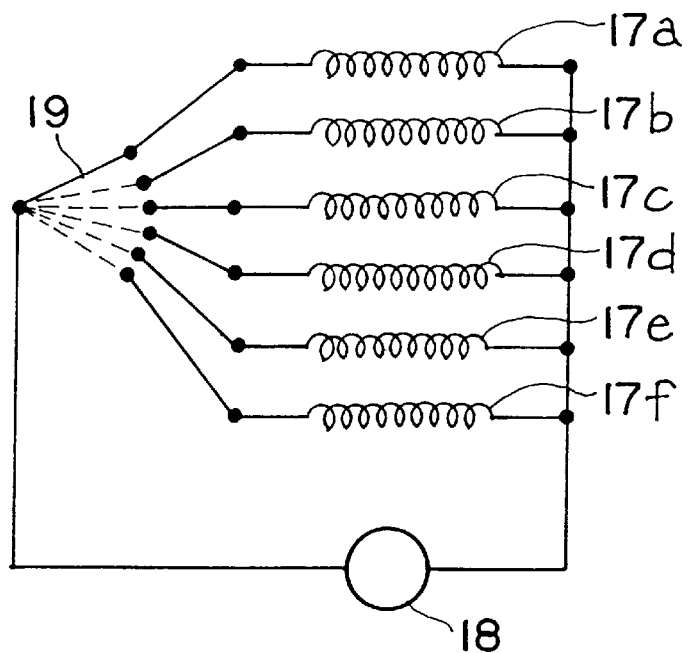
FIG. 6A is a schematic view of a magnetic coil power circuit according to one aspect of the invention used in connection with the coils shown in FIG. 5.
Figure 6B:
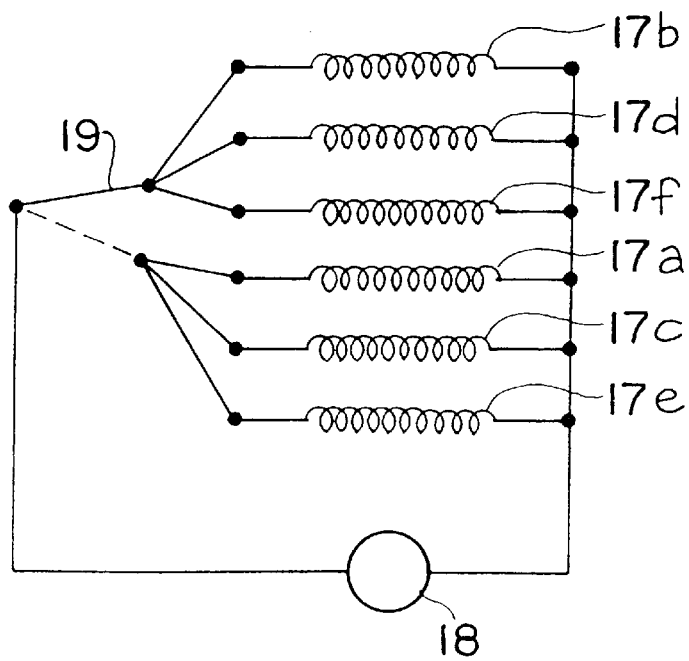
FIG. 6B is a schematic view of a magnetic coil power circuit according to an alternative aspect of the invention used in connection with the coils shown in FIG. 5.

Referring to FIG. 4, the platen 13 is moved to the right, as indicated by the arrow, along the track 12 by sequentially applying a current to coils 17a, 17b, 17c, 17d, 17e, 17f, respectively. As current is applied to coil 17a, the coil is attracted to metal edge 16a, causing rightward movement of the platen 13. Subsequent sequential application of current to coils 17b, 17c, etc. cause each of these coils to be attracted to metal edge 16a, thereby causing further movement of the platen. A schematic illustrating the connection of the coils 17 to the servo amplifier 18 through switch 19 according to this method is illustrated in FIG. 6A. Another alternative would be to simultaneously apply current to coils 17a, 17c and 17e causing them to be attracted toward metal edges 16a, 16b and 16c, respectively, thereby moving the platen to the right. The current to coils 17a, 17c, 17e may then be switched off and current applied to coils 17b, 17d, 17f causing attraction toward metal edges 16a, 16b, 16c, respectively. A schematic illustrating the connection of the coils 17 to the servo amplifier 18 through switch 19 according to this method is illustrated in FIG. 6B. The above described methods of sequentially magnetizing the coils 17 are but two examples of many methods of magnetization which may be employed to procure movement of the platen. Other such methods will readily suggest themselves to those of ordinary skill in the art. Power to each coil is sequenced to cause attainment of sequential ones of the metal edges to move the effector to a desired position. According to one aspect of the invention, when power to the coils is terminated, the platen will continue to slide along the track until all energy has been expended. Alternatively, the platen may include fail safe brakes which are held open by power supplied to the coils and which close upon power shut off thereby stopping the platen.

In operation, the motorized platens 13a, 13b of the independent dual-blade robot 10 shown in FIGS. 1 & 2 can be moved along the linear track 12 independently. This configuration permits one of the motorized platens 13a to extend its blade 14a through a slit valve 102 into an adjacent process chamber 101, while the other motorized platen 13b remains in a stationary position. Alternatively, if two process chamber are located 180 degrees from one another about the transfer chamber, the second motorized platen 13b may extend its blade 14b into the adjacent process chamber 101 simultaneous with the extension of the first motorized platen blade 14a into its respective adjacent process chamber.

According to one mode of operation, the rotatable stage 11 may be actuated to position the first motorized platen 13a and blade 14a in line with a slit valve 102 of an adjacent process chamber 101. The drive mechanism of the motorized platen 13a may then be actuated to drive the platen 13a along the track 12 to extend the blade 14a through the slit valve 102 into the adjacent chamber 101. The blade 14a may be carrying a wafer for placement into the adjacent chamber 101 for processing, or may be empty for retrieving a wafer which has already been processed in the chamber 101. In a typical configuration, where openings to process chambers are not located 180 degrees apart, the second motorized platen 13b remains stationary until the first platen 13a and blade 14a are withdrawn from the process chamber 101 into the transfer chamber 100. The rotatable stage 11 may then rotate the device to position the second motorized platen 13b and blade 14b in line with a slit valve 102 of an adjacent process chamber 101. The drive mechanism of the motorized platen 13b may then be actuated to drive the platen 13b along the track 12 to extend the blade 14b through the slit valve 102 into the adjacent chamber 101. As with the first platen blade, the second platen blade 14b may be carrying a wafer for placement into the adjacent chamber 101 for processing, or may be empty for retrieving a wafer which has already been processed in the chamber 101. Once the second platen 13b and blade 14b are withdrawn from the process chamber, the rotatable stage may be actuated to position either the first motorized platen blade 14a or the second motorized platen blade 14bfor extension into an adjacent chamber.

Figure 7:
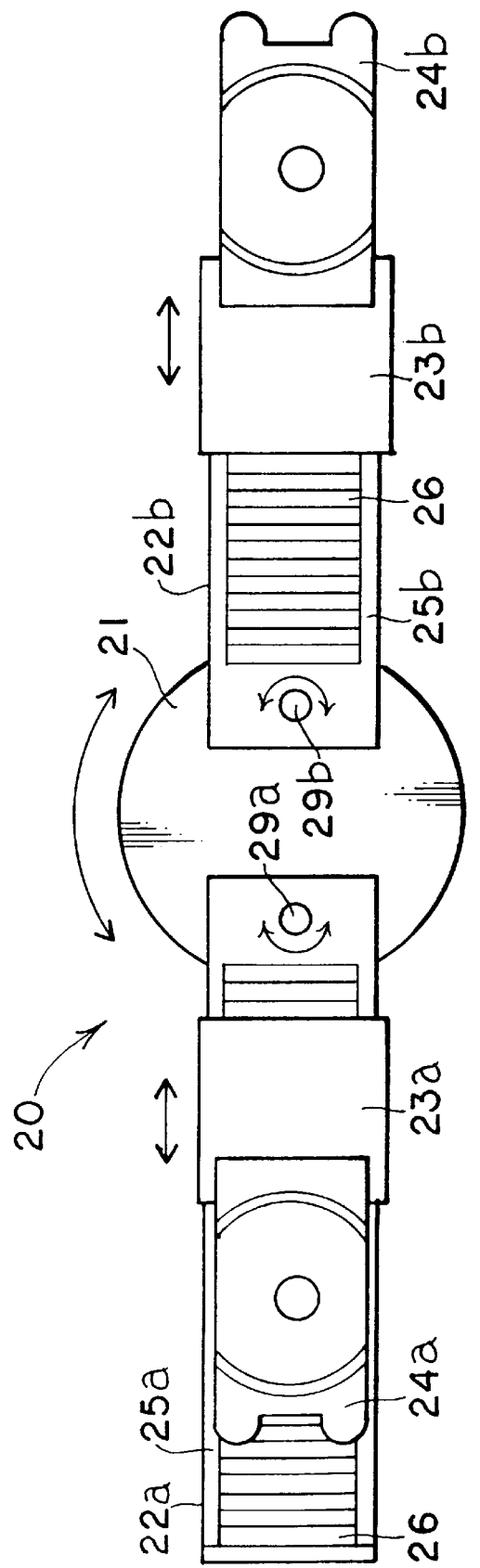
FIG. 7 is a top plan view of an independent dual-blade robot according to a second aspect of the present invention.
Figure 8:
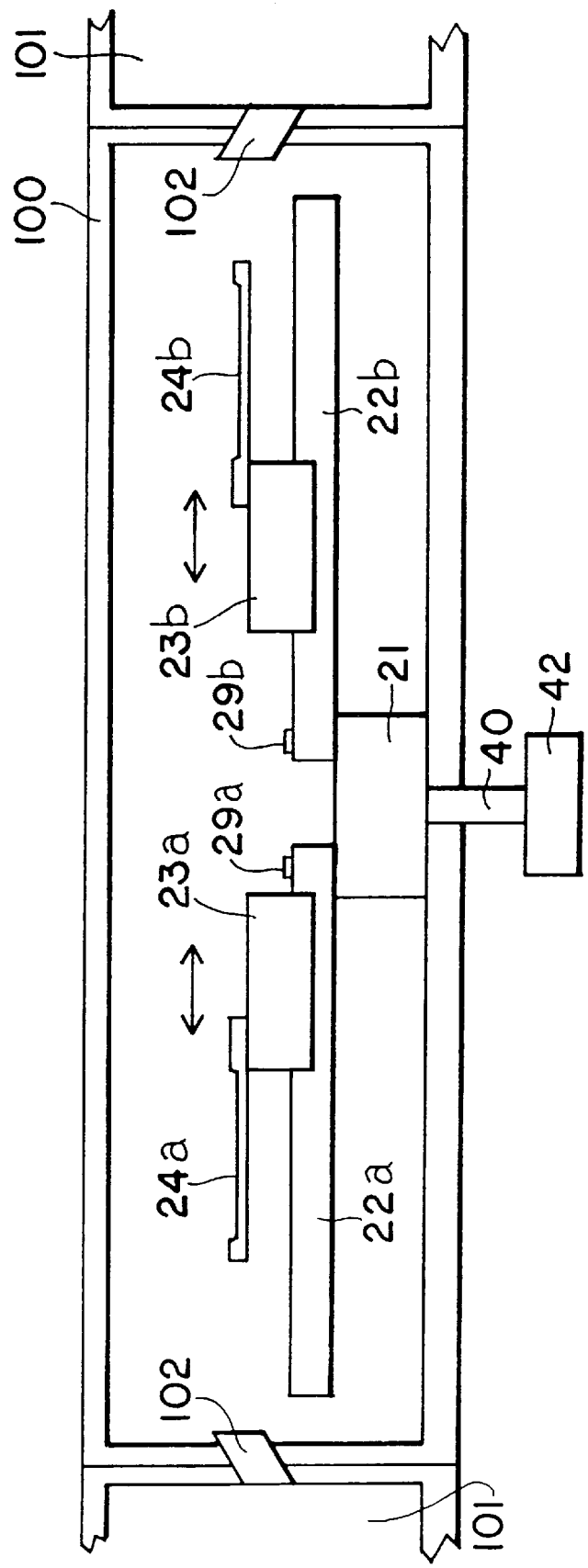
FIG. 8 is a side elevational view of the independent dual-blade robot of FIG. 7.

FIGS. 7 & 8 illustrate an independent dual-blade robot 20 according to an alternative embodiment of the present invention, shown in the context of a semiconductor wafer processing system. The independent dual-blade robot assembly 20 is centrally arranged within a transfer chamber 100 of the wafer processing system. The transfer chamber 100 is connected to a plurality of adjacent chambers 101, such as process chambers for deposition, etching or the like, by a corresponding plurality of slit valves 102.

The robot assembly 20 includes a rotatable stage 21 connected to a drive shaft 40 which extends through a sealed aperture in the lower wall of the chamber. First and second linear track sections 22a, 22b are pivotally mounted to an upper end of the stage 21 by pivot pins 29a, 29b, respectively. A pair of motorized platens 23a, 23b are slidably mounted on the linear track sections 22a, 22b, respectively. Each motorized platen 23a, 23b carries an end effector 24a, 24b, respectively, on a leading edge thereof. The upper surface of each linear track section 22a, 22b exhibits a linear bearing 25a, 25b, respectively, along each of the longitudinal edges thereof to guide the motorized platens 23a, 23b. The central portion of each track section upper surface includes a plurality of raised metal edges 26, disposed in a spaced, parallel relation to one another and substantially perpendicular to the linear bearings 25a, 25b. The raised metal edges 26 are preferably formed of a ferromagnetic material such as iron, which is coated with a thin protective layer of corrosion resultant material such as zinc. As in the first embodiment, a plurality of coils 17 are carried within each of the motorized platens 23a, 23b, for electromagnetically interacting with the raised metal edges 26 of respective linear track sections 22a, 22bto drive the platens along the track sections.

To enable arcuate travel of the end effectors 24a, 24b, a drive motor 42 may be connected to a lower end of the drive shaft 40 below the transfer chamber 100 to rotate the stage 21, as needed, through a full 360° range of motion. The same or a different drive motor may provide pivotal motion as needed to pivot pins 29a, 29b, to pivot each one of the track sections 22a, 22b about its respective pivot pin. Preferably three separate drive motors are individually electromagnetically coupled to the rotatable stage 21 and pivot pins 29a, 29b, respectively. The range of pivotal motion of each track section is limited only by the location of the other track section. Preferably, each track section may pivot at least 180° about its respective pivot pin.

In operation, the motorized platens 23a, 23b of the independent dual-blade robot 20 shown in FIGS. 7 & 8 can be moved along the respective linear track sections 22a, 22b independently. Furthermore, each of the linear track sections 22a, 22b may be rotated about its respective pivot pin 29a, 29b independently. This configuration permits simultaneous extension of the first and second platen blades into corresponding process chambers, even where the respective process chambers are not positioned 180 degrees apart about the transfer chamber.

According to one mode of operation, the rotatable stage 21 may be actuated to position the first motorized platen 23a and blade 24a in line with a slit valve 102 of an adjacent process chamber 101. The drive mechanism of the motorized platen 23a may then be actuated to drive the platen 23a along the track section 22a to extend the blade 24a through the slit valve 102 into the adjacent chamber 101. The blade 24a may be carrying a wafer for placement into the adjacent chamber 101 for processing, or may be empty for retrieving a wafer which has already been processed in the chamber 101. While the first platen blade is being extended into its respective adjacent chamber, the second platen 23b and blade 24b may be aligned with another process chamber 101 by pivoting the track section 22b about its pivot pin 29b. The drive mechanism of the motorized platen 23b may then be actuated to drive the platen 23b along the track section 22b to extend the blade 24b through the slit valve 102 into the adjacent chamber 101. As with the first platen blade, the second platen blade 24b may be carrying a wafer for placement into the adjacent chamber 101 for processing, or may be empty for retrieving a wafer which has already been processed in the chamber 101. Once both the first platen 23a and blade 24a and the second platen 23b and blade 24b have been withdrawn from the respective process chambers, the rotatable stage may be actuated to position either the first motorized platen blade 24a or the second motorized platen blade 24b for extension into an adjacent chamber.

Figure 9:
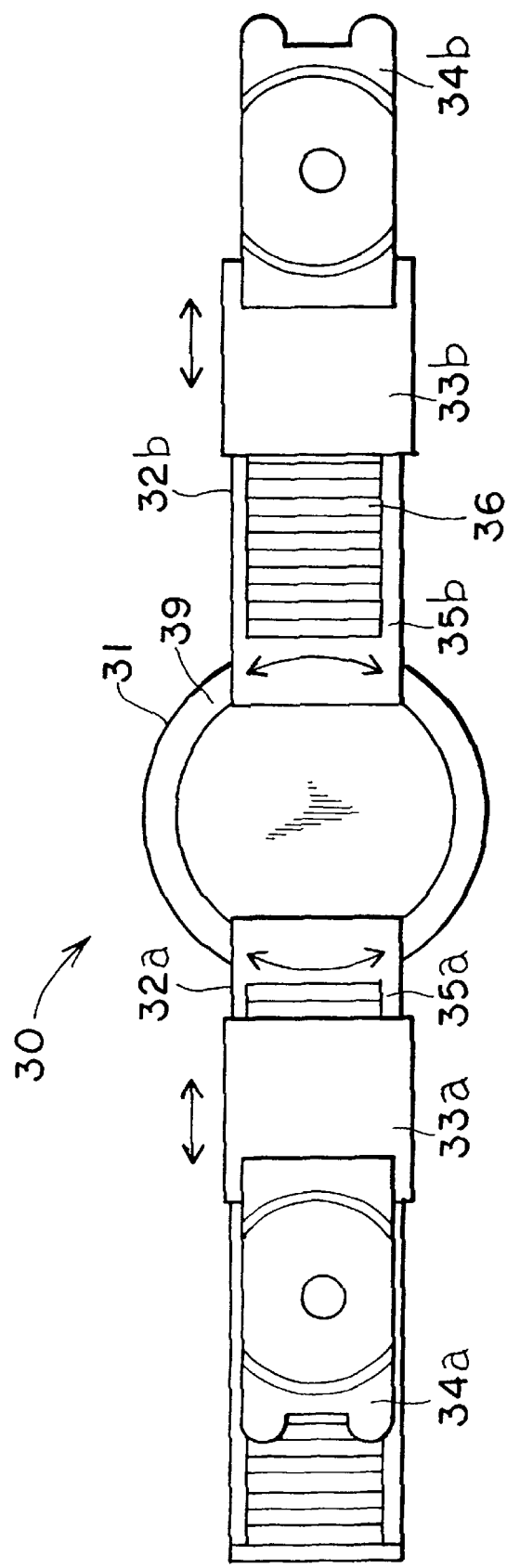
FIG. 9 is a top plan view of an independent dual-blade robot according to a third aspect of the present invention.
Figure 10:
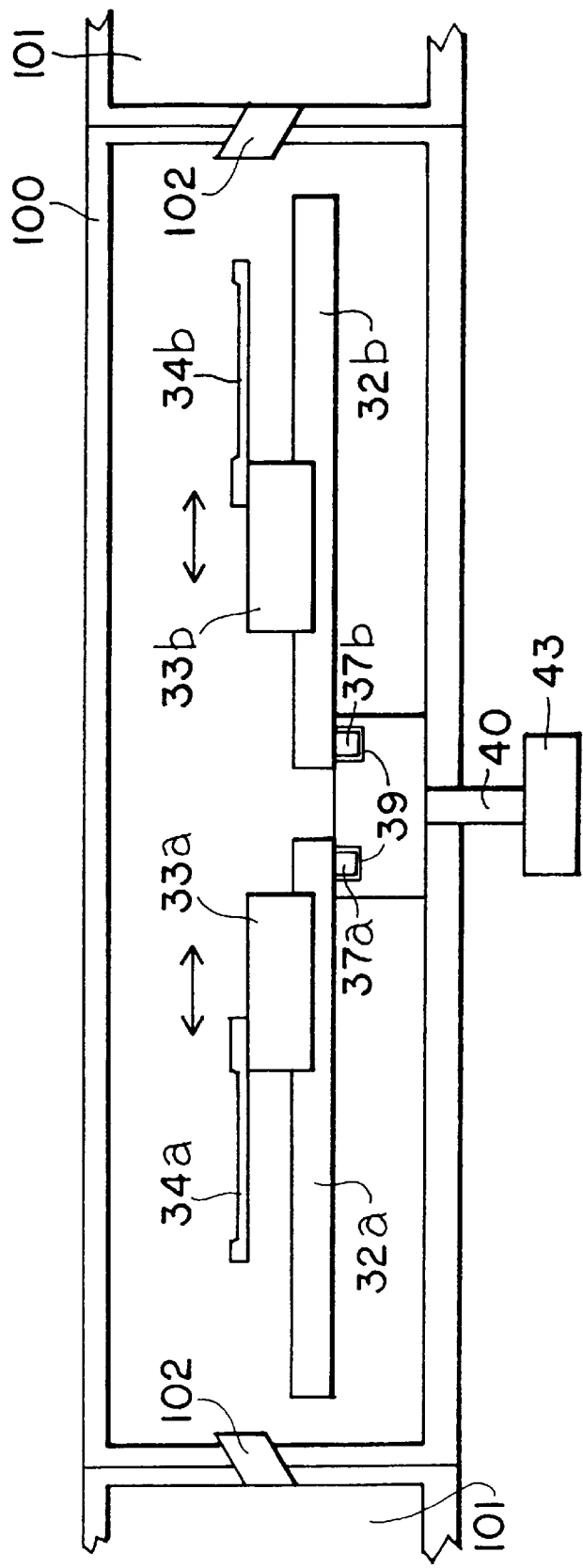
FIG. 10 is a side elevational view of the independent dual-blade robot of FIG. 9.

FIGS. 9 & 10 illustrate an independent dual-blade robot 30 according to a further alternative embodiment of the present invention, shown in the context of a semiconductor wafer processing system. The independent dual-blade robot assembly 30 is centrally arranged within a transfer chamber 100 of the wafer processing system. The transfer chamber 100 is connected to a plurality of adjacent chambers 101, such as process chambers for deposition, etching or the like, by a corresponding plurality of slit valves 102.

The robot assembly 30 includes a rotatable stage 31 connected to a drive shaft 40 which extends through a sealed aperture in the lower wall of the chamber. First and second linear track sections 32a, 32b are rotatably mounted within a race 39 formed in an upper portion of the stage 31. A pair of motorized platens 33a, 33b are slidably mounted on the linear track sections 32a, 32b, respectively. Each motorized platen 33a, 33b carries an end effector 34a, 34b, respectively, on a leading edge thereof. The upper surface of each linear track section 32a, 32b exhibits a linear bearing 35a, 35b, respectively, along each of the longitudinal edges thereof to guide the motorized platens 33a, 33b. The central portion of each track section upper surface includes a plurality of raised metal edges 36, which are preferably formed of a ferromagnetic material such as iron, coated with a protective layer of zinc. As in the first and second embodiments, a plurality of coils 17 are carried within each of the motorized platens 33a, 33b, for electromagnetically interacting with the raised metal edges 36 of respective linear track sections 32a, 32b to drive the platens along the track sections.

A drive motor 43 may be connected to a lower end of the drive shaft 40 below the transfer chamber 100 for rotating the stage 31, as needed, through a full 360° range of motion. The same or a different drive motor may provide rotary motion to linear track sections 32a, 32b, rotate each track section in the race 39 about a central axis of the stage 31. A bearing 37a, 37b extending from each respective linear track section 32a, 32b may be positioned within the race for sliding engagement therewith. According to one aspect, a separate drive motor is provided for each linear track section to effect rotation about the hub. Each bearing 37a, 37b is magnetically coupled to a stepper motor (not shown) which can be actuated to provide rotary motion. The track sections 32a, 32b may be rotated a full 360° about the race.

In operation, the motorized platens 33a, 33b of the independent dual-blade robot 30 shown in FIGS. 9 & 10 can be moved along the respective linear track sections 32a, 32b independently. Furthermore, each of the linear track sections 32a, 32b may be independently rotated about a central axis of the stage 31 in the race 39. This configuration permits completely independent operation of the two motorized platens, including simultaneous extension of the first and second platen blades into corresponding process chambers, even where the respective process chambers are not positioned 180 degrees apart about the transfer chamber.

According to one mode of operation, the rotatable stage 31 may be actuated to position the first motorized platen 33a and blade 34a in line with a slit valve 102 of an adjacent process chamber 101. The drive mechanism of the motorized platen 33a may then be actuated to drive the platen 33a along the track section 32a to extend the blade 34a through the slit valve 102 into the adjacent chamber 101. The blade 34a may be carrying a wafer for placement into the adjacent chamber 101 for processing, or may be empty for retrieving a wafer which has already been processed in the chamber 101. While the first platen blade is being extended into its respective adjacent chamber, the second platen 33b and blade 34b may be independently aligned with another process chamber 101 by movement of the track section 32b through the race 39. The drive mechanism of the second motorized platen 33b may then be actuated to drive the platen 33b along the track section 32b to extend the blade 34b through the slit valve 102 into the adjacent chamber 101. As with the first platen blade, the second platen blade 34b may be carrying a wafer for placement into the adjacent chamber 101 for processing, or may be empty for retrieving a wafer which has already been processed in the chamber 101. Once both the first platen 33a and blade 34a and the second platen 33b and blade 34b have been withdrawn from the respective process chambers, the rotatable stage may be actuated to position either the first motorized platen blade 34a or the second motorized platen blade 34b for extension into an adjacent chamber.

The range of circular motion of each of linear track section 32a, 32b within the race 39 is limited only by the other linear track section. In this manner, the first platen and blade assembly, by utilizing its independent connection to the race 39 to achieve independent arcuate motion, may operate completely independently from the second platen and blade assembly, which also utilizes its independent connection to the race 39 to achieve independent arcuate motion.

The present invention, therefore, is well adapted to carry out the objects and attain the ends and advantages mentioned as well as others inherent therein. While presently preferred embodiments of the invention are given for the purpose of disclosure, numerous changes in the details will readily suggest themselves to those skilled in the art and which are encompassed within the spirit of the invention and the scope of the appended claims.

I claim:

1. An apparatus for transferring articles comprising:
   a rotatable stage located within a chamber;
   a linear track mounted on an upper surface of said rotatable stage; and
   article-handling means slidably mounted on said linear track and configured for movement along a longitudinal axis of said linear track;

wherein said article-handling means comprises:
- a first slider block sidably mounted on said linear track;
- a first-end effector extending from a leading edge of said first slider block;
- a second slider block slidably mounted on said linear track;
- a second end effector extending from a leading edge of said second slider block; and
- wherein each of said first and second slider blocks comprises a motorized platen; and
- wherein said motorized platen comprises a plurality of coils electrically connected to a power supply and said track comprises a plurality of spaced raised metallic edges extending laterally across the track from an upper surface thereof.

2. The apparatus of claim 1 wherein said track further comprises linear bearing surfaces extending longitudinally along the edges of the track.

3. The apparatus of claim 1 further comprising means for sequentially connecting said power source to each of said plurality of coils.

4. An apparatus for transferring articles comprising:
- a rotatable stage located within a chamber;
- a linear track mounted on an upper surface of said rotatable stage; and
- article-handling means slidably mounted on said linear track and configured for movement along a longitudinal axis of said linear track; and
- wherein said linear track comprises a plurality of linear track sections, each of said plurality of linear track sections being pivotally connected at one end thereof to the rotatable stage.

5. The apparatus for transferring articles according to claim 4, wherein said plurality of linear track sections comprises two linear track sections.

6. The apparatus for transferring articles according to claim 5, wherein said article handling means comprises:
- a first slider block slidably mounted on a first one of said two linear track sections;
- a first end effector extending from a leading edge of said first slider block;
- a second slider block slidably mounted on a second one of said two linear track sections;
- a second end effector extending from a leading edge of said second slider block.

7. The apparatus for transferring articles according to claim 6, wherein a first one of said two linear track sections is pivotally mounted on said rotatable stage at a position 180° from the pivotal mounting position of a second one of said two linear track sections.

8. The apparatus for transferring articles according to claim 7, wherein each of said first and second track sections is rotatable at least 180° about the pivotal connection.

* * * * *